(12) United States Patent
Huang et al.

(10) Patent No.: US 12,538,427 B2
(45) Date of Patent: Jan. 27, 2026

(54) CIRCUIT BOARD AND METHOD OF MANUFACTURING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei (TW)

(72) Inventors: Xiao-Long Huang, Hebei Province (CN); Yu-Jia Men, Hebei Province (CN)

(73) Assignees: GARUDA TECHNOLOGY CO., LTD., New Taipei (TW); HONGQISHENG PRECISION ELECTRONICS (QINHUANGDAO) CO., LTD., Hebei Province (CN); AVARY HOLDING (SHENZHEN) CO., LTD, Shenzhen (CN)

( * ) Notice: Subject to any disclaimer, the term of this patent is extended or adjusted under 35 U.S.C. 154(b) by 207 days.

(21) Appl. No.: 18/474,724

(22) Filed: Sep. 26, 2023

(65) Prior Publication Data
US 2025/0107005 A1 Mar. 27, 2025

(51) Int. Cl.
*H05K 1/18* (2006.01)
*H05K 1/02* (2006.01)
(Continued)

(52) U.S. Cl.
CPC .......... *H05K 1/183* (2013.01); *H05K 1/0231* (2013.01); *H05K 1/111* (2013.01); *H05K 1/16* (2013.01);
(Continued)

(58) Field of Classification Search
CPC ...... H05K 1/183; H05K 1/0231; H05K 1/111; H05K 1/16; H05K 2201/0183
(Continued)

(56) References Cited

U.S. PATENT DOCUMENTS

2004/0246690 A1 12/2004 Nakamura et al.
2012/0181658 A1 7/2012 Mohammed et al.
(Continued)

FOREIGN PATENT DOCUMENTS

CN 101038885 A 9/2007
CN 101351092 A 1/2009
(Continued)

*Primary Examiner* — Binh B Tran
(74) *Attorney, Agent, or Firm* — MUNCY, GEISSLER, OLDS & LOWE, P.C.

(57) ABSTRACT

A provided circuit board includes an embedded capacitor, a substrate, and an insulating layer. The embedded capacitor includes a dielectric layer, a first electrode and a second electrode. The dielectric layer has a first side surface, a second side surface adjacent to the first side surface, a third side surface opposite to the first side surface, and a fourth side surface opposite to the second side surface. The first and second electrodes respectively cover the first and third side surfaces. The substrate surrounds the embedded capacitor and is physically connected to the second and fourth side surfaces. The first electrode is between the first side surface and a sidewall of the substrate. The insulating layer covers the embedded capacitor and the substrate and extends from an upper surface to a lower surface of the substrate along the first electrode and the sidewall of the substrate.

19 Claims, 11 Drawing Sheets

(51) Int. Cl.
    *H05K 1/11*          (2006.01)
    *H05K 1/16*          (2006.01)

(52) U.S. Cl.
    CPC ............... *H05K 2201/0183* (2013.01); *H05K 2201/09227* (2013.01); *H05K 2203/0186* (2013.01)

(58) Field of Classification Search
    USPC ......................................................... 361/761
    See application file for complete search history.

(56) References Cited

U.S. PATENT DOCUMENTS

| | | | | |
|---|---|---|---|---|
| 2013/0248234 | A1* | 9/2013 | Inagaki | H05K 1/183 |
| | | | | 174/260 |
| 2014/0293559 | A1* | 10/2014 | Suzuki | H05K 1/185 |
| | | | | 361/761 |
| 2017/0181288 | A1 | 6/2017 | Fujii | |
| 2018/0254252 | A1* | 9/2018 | Nakagawa | H01L 23/50 |
| 2019/0380200 | A1 | 12/2019 | Tseng et al. | |
| 2020/0258688 | A1 | 8/2020 | Berolini et al. | |

FOREIGN PATENT DOCUMENTS

| | | |
|---|---|---|
| CN | 101534610 A | 9/2009 |
| CN | 104093284 A | 10/2014 |
| JP | 2000353871 A | 12/2000 |
| JP | 2012151154 A | 8/2012 |
| TW | I252720 B | 4/2006 |
| TW | 200731889 A | 8/2007 |
| TW | 201309128 A | 2/2013 |
| TW | I793897 B | 2/2023 |

\* cited by examiner

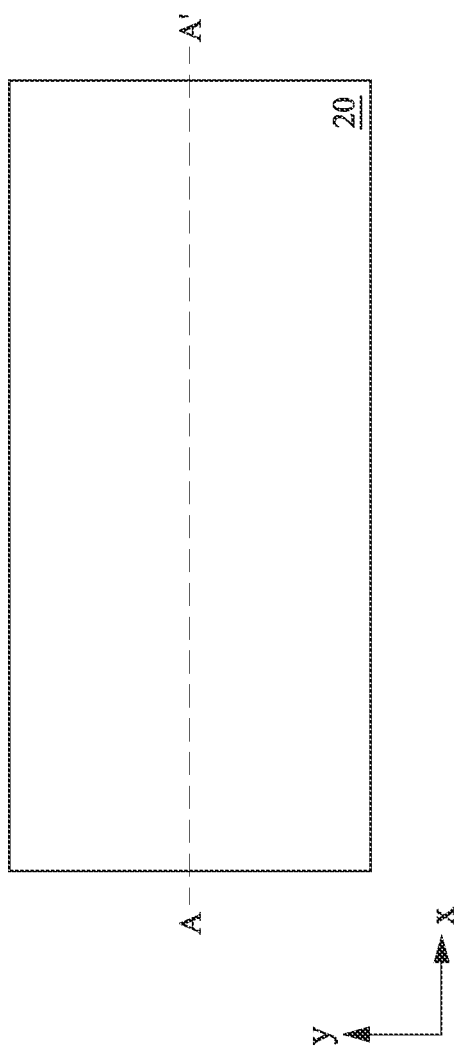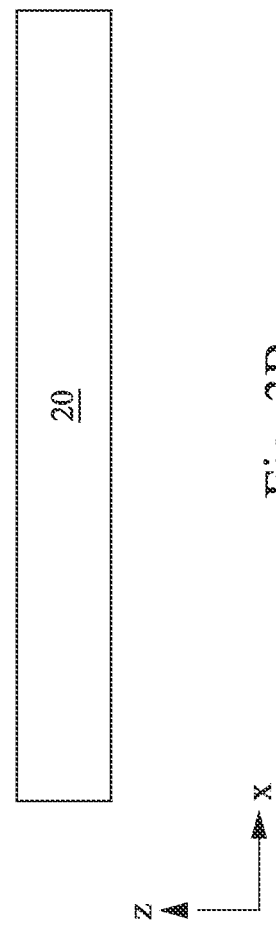
Fig. 3A
Fig. 3B

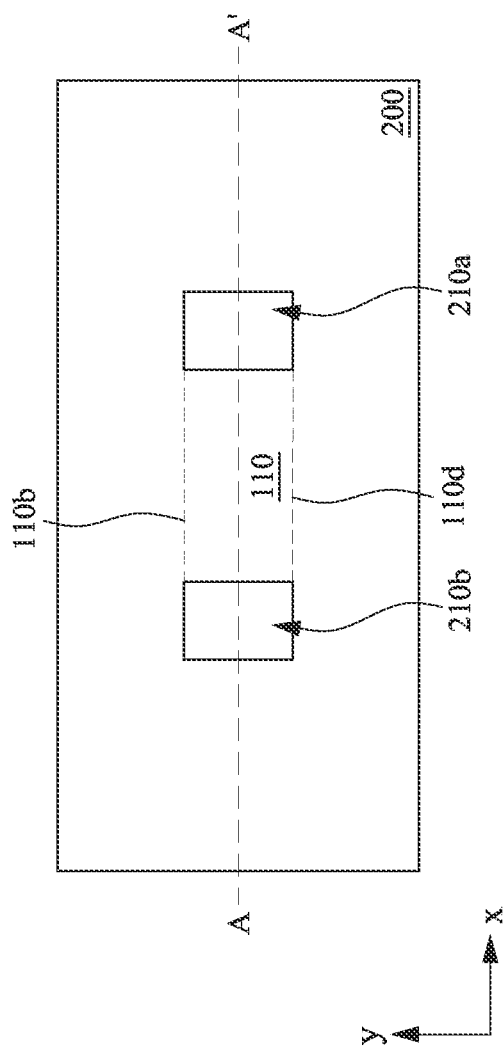
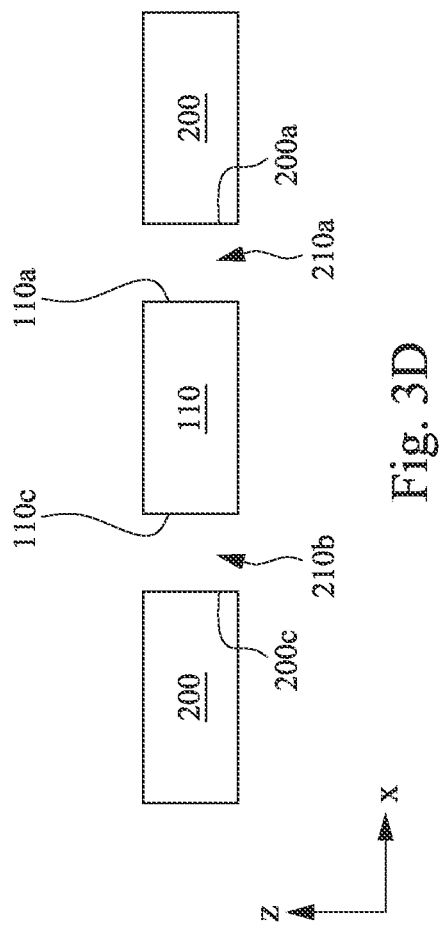

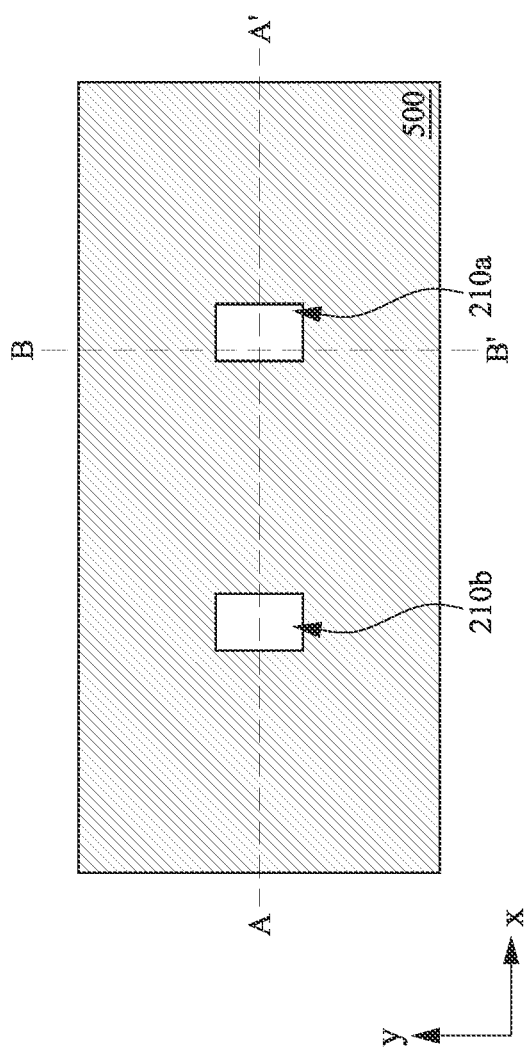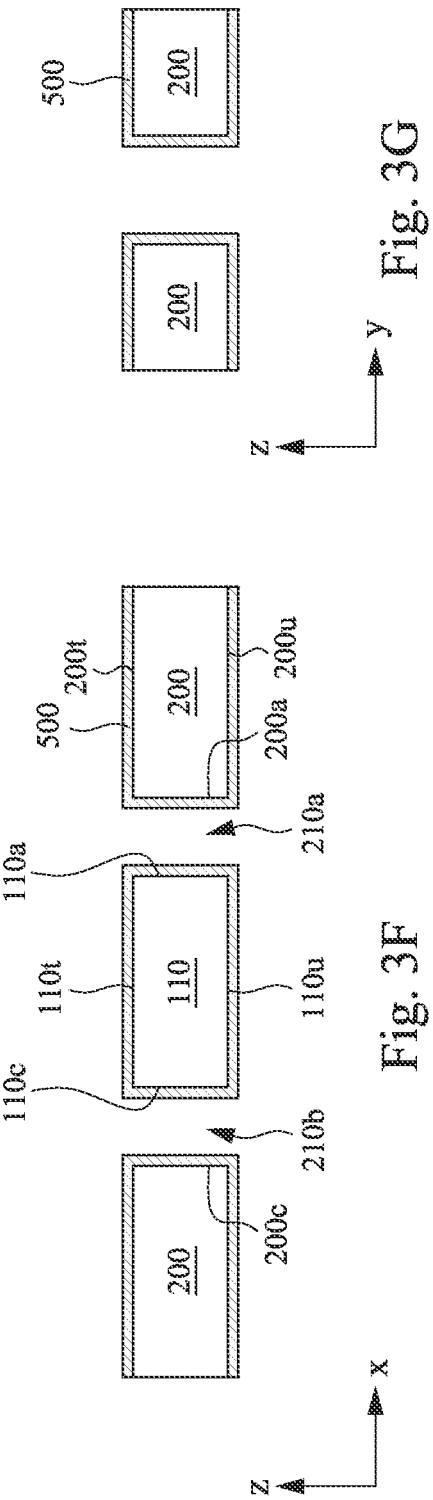

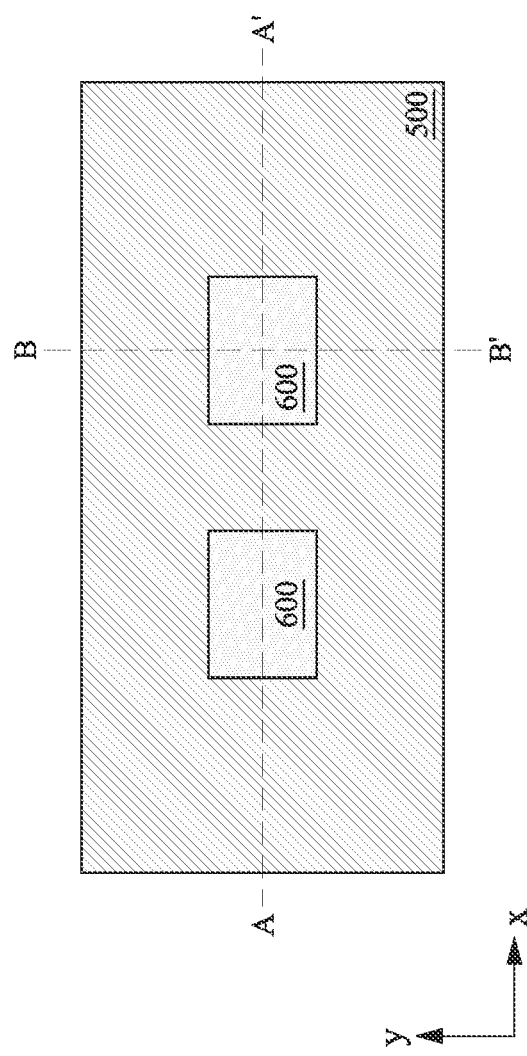
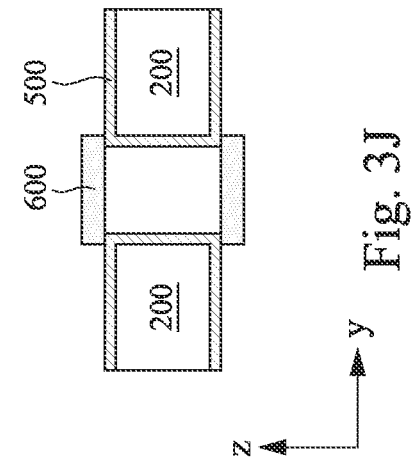
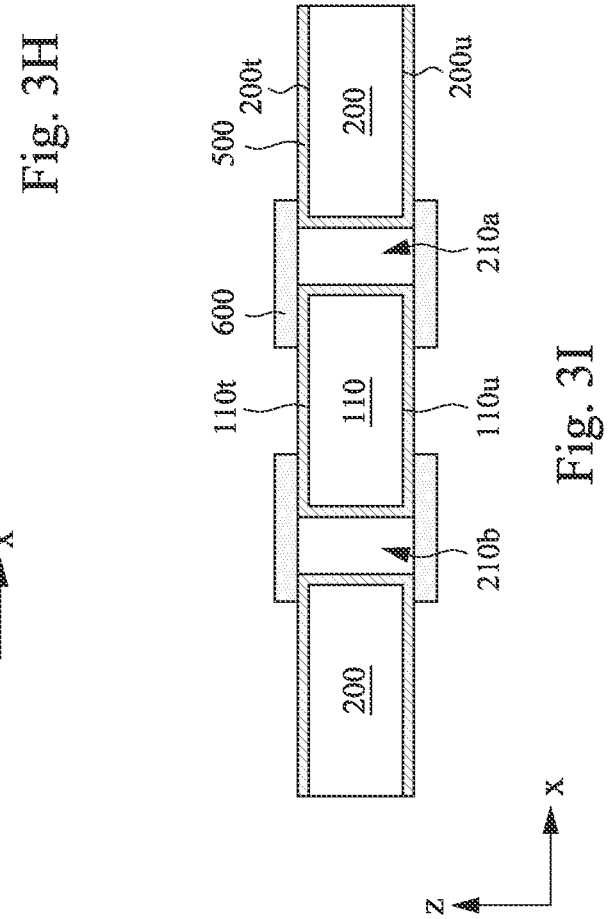

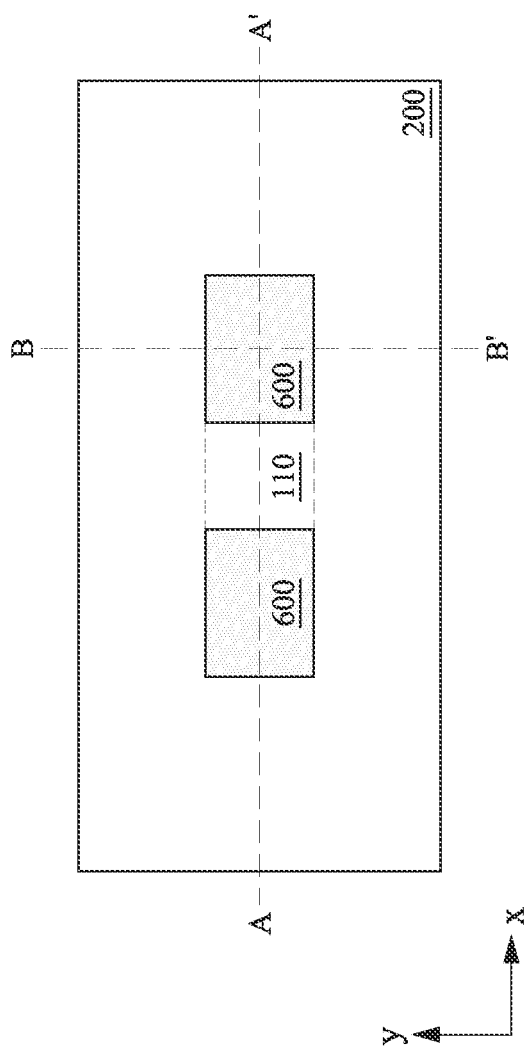
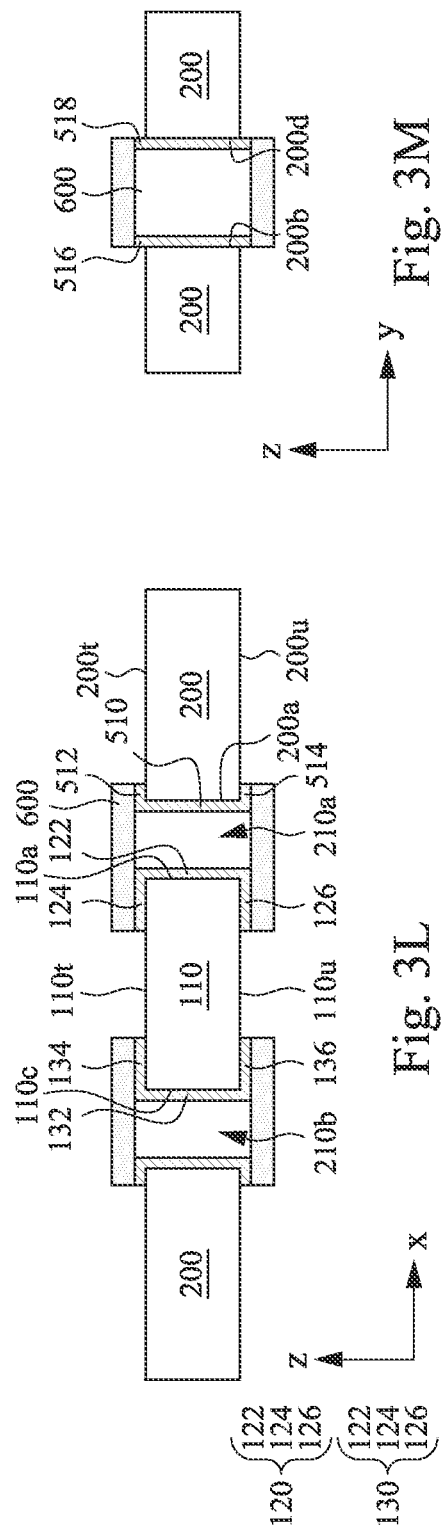
Fig. 3K
Fig. 3L
Fig. 3M

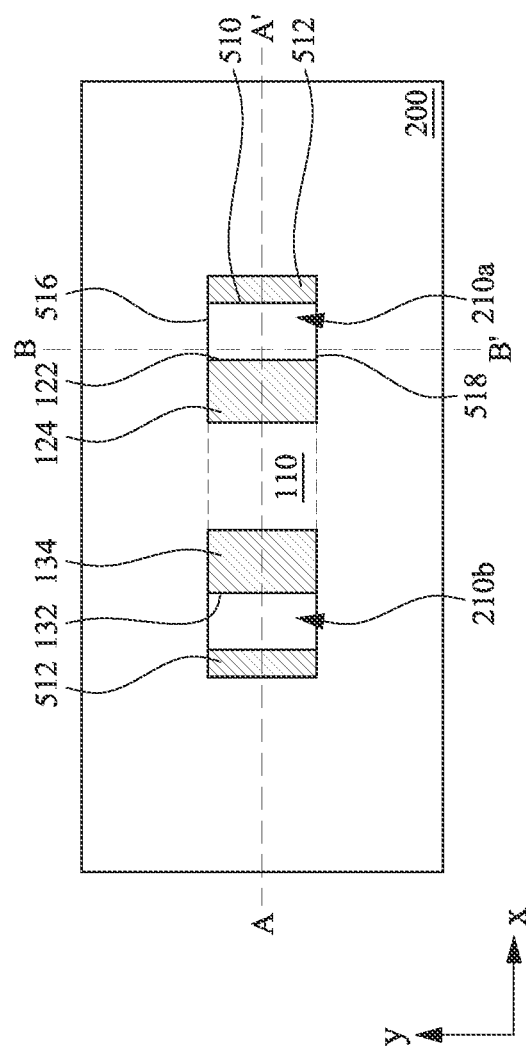
Fig. 3N
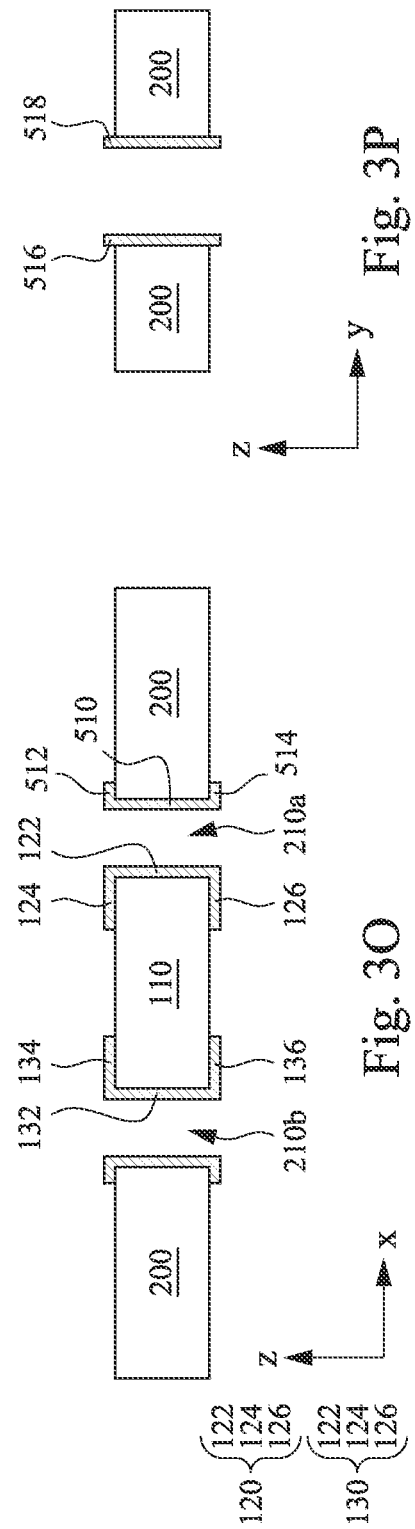
Fig. 3O
Fig. 3P

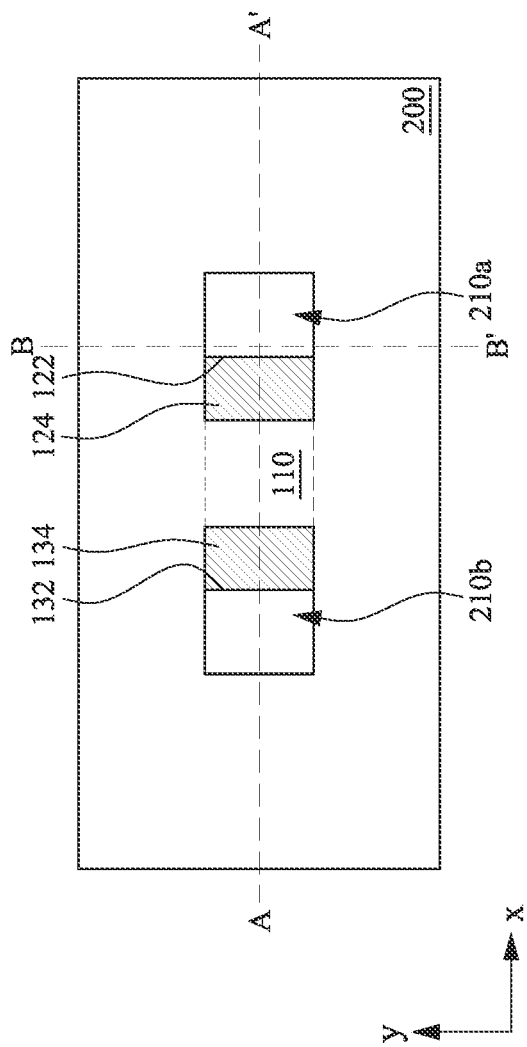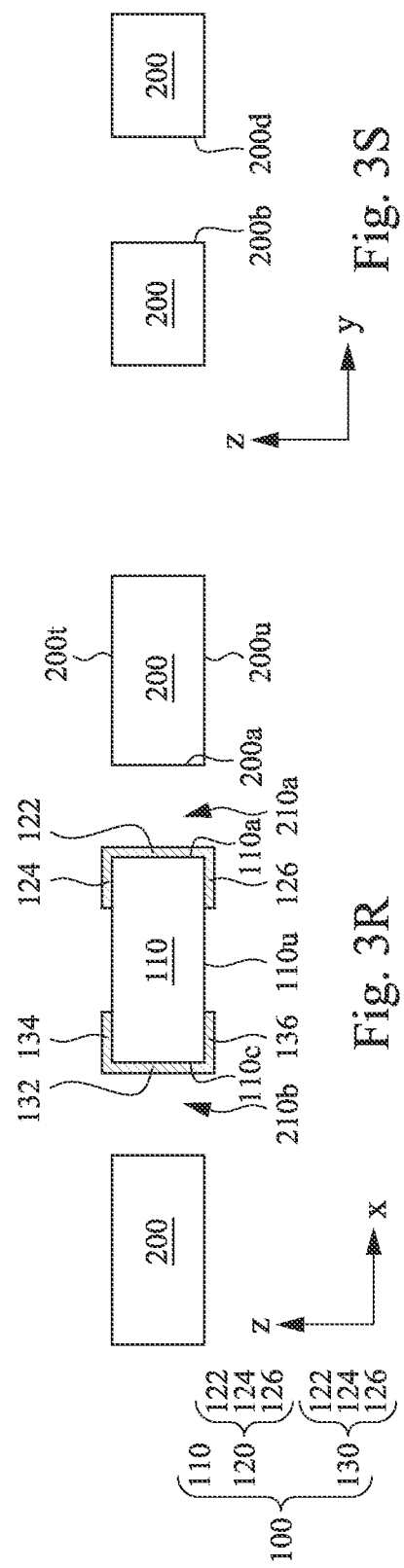
Fig. 3Q
Fig. 3R
Fig. 3S

CIRCUIT BOARD AND METHOD OF MANUFACTURING THE SAME

BACKGROUND

Field of Invention

The present disclosure relates to a circuit board and a method of manufacturing the same, and in particular to a circuit board including an embedded capacitor.

Description of Related Art

An embedded lamination method is usually used in a process of manufacturing a circuit board to bury an embedded capacitor into the circuit board. However, when a size of the embedded capacitor is small, the embedded capacitor is easily deviated due to impact of a flowing material during the lamination process, resulting in abnormal function or failure of the circuit board. In addition, the small-sized embedded capacitor often has small-sized pads, which makes it more difficult to electrically connect a circuit layer in the circuit board with the embedded capacitor.

SUMMARY

In order to solve the above issues, the present disclosure provides a circuit board including an embedded capacitor and a method of manufacturing the same, which can manufacture the accurately positioned embedded capacitor by using simplified processes, thereby improving reliability of the circuit board and degree of integration of components.

According to an embodiment of the present disclosure, a circuit board includes a first embedded capacitor, a substrate, and an insulating layer. The first embedded capacitor includes a dielectric layer, a first electrode and a second electrode, in which the dielectric layer has a first side surface, a second side surface adjacent to the first side surface, a third side surface opposite to the first side surface, and a fourth side surface opposite to the second side surface, and the first electrode and the second electrode respectively cover the first side surface and the third side surface. The substrate surrounds the first embedded capacitor, in which the substrate is physically connected to the second side surface and the fourth side surface of the dielectric layer, and the first electrode is located between the first side surface and a sidewall of the substrate. The insulating layer covers the first embedded capacitor and the substrate, in which the insulating layer extends from an upper surface of the substrate to a lower surface of the substrate along the first electrode and the sidewall.

In some embodiments, the substrate and the dielectric layer are integrally formed into one piece.

In some embodiments, the dielectric layer has an upper surface connecting the first side surface and the second side surface, and the upper surface of the substrate and the upper surface of the dielectric layer are coplanar.

In some embodiments, the first electrode includes a first pad on the dielectric layer, a second pad beneath the dielectric layer, and an electrode plate physically connecting the first pad and the second pad.

In some embodiments, the circuit board further includes a trace on the upper surface of the substrate, in which the first pad and the trace have a same thickness.

In some embodiments, the circuit board further includes a contact located in the insulating layer and electrically connected to the first electrode, in which an area of the first pad matches an area of the contact.

In some embodiments, the first electrode includes a first pad on the dielectric layer, and the second electrode includes a second pad on the dielectric layer, and the second pad and the first pad are separated from each other.

In some embodiments, a total length of the first embedded capacitor is a sum of a length of the first pad, a length of the second pad and a distance between the first pad and the second pad.

In some embodiments, opposite edges of the first electrode are respectively aligned with the second side surface and the fourth side surface of the dielectric layer.

In some embodiments, the dielectric layer and the substrate are formed of a dielectric material including silicon, ceramics, glass, epoxy glass, graphene oxide, or a combination thereof.

In some embodiments, the insulating layer fills between the first electrode and the sidewall of the substrate and fills between the second electrode and the substrate.

In some embodiments, the circuit board further includes a second embedded capacitor, in which the second embedded capacitor includes a dielectric layer, a third electrode and a fourth electrode, and a length of the dielectric layer of the second embedded capacitor between the third electrode and the fourth electrode is different from a length of the dielectric layer of the first embedded capacitor between the first electrode and the second electrode.

In some embodiments, the circuit board further includes a second embedded capacitor, in which the second embedded capacitor includes a dielectric layer, a third electrode and a fourth electrode, and a pad area of the first electrode on the dielectric layer of the first embedded capacitor is different from a pad area of the third electrode on the dielectric layer of the second embedded capacitor.

According to an embodiment of the present disclosure, a method of manufacturing a circuit board includes following steps. An initial substrate is provided. A first perforating process is performed on the initial substrate to form a pair of openings, a dielectric layer between the pair of openings, and a substrate physically connected to the dielectric layer, in which the dielectric layer has a pair of side surfaces facing the pair of openings and opposite to each other. A conductive layer is formed on the substrate, on the dielectric layer and in the pair of openings. A mask is formed on the conductive layer, in which the mask at least shields the pair of openings. The conductive layer is etched by using the mask to expose the dielectric layer and the substrate, and the conductive layer in the pair of openings is remained. The mask is removed after etching the conductive layer by using the mask. After removing the mask, a part of the conductive layer on the pair of side surfaces of the dielectric layer is remained, and other part of the conductive layer outside the pair of side surfaces in the pair of openings is removed.

In some embodiments, the step of forming the mask on the conductive layer includes shielding a conductive portion of the conductive layer on the dielectric layer with the mask, and the step of remaining the conductive layer after removing the mask further includes remaining the conductive portion on the dielectric layer.

In some embodiments, the step of removing other part of the conductive layer outside the pair of side surfaces in the pair of openings includes performing a second perforating process along the pair of openings to expand the pair of openings in a direction away from the pair of side surfaces.

In some embodiments, same process steps are used in the first perforating process and the second perforating process.

In some embodiments, the step of forming the mask on the conductive layer includes shielding a conductive portion of the conductive layer with the mask, in which the conductive portion is on a substrate portion of the substrate; and the step of performing the second perforating process includes removing the conductive portion and the substrate portion.

In some embodiments, the step of forming the conductive layer in the pair of openings includes remaining a pair of voids in the pair of openings, and the step of forming the mask on the conductive layer includes remaining the pair of voids in the pair of openings.

In some embodiments, the method further includes forming an insulating layer on the dielectric layer and on the substrate, in which the insulating layer is in physical contact with the dielectric layer and the substrate. The insulating layer extends into the pair of openings to be in physical contact with the conductive layer on the pair of side surfaces.

According to the above embodiments, the circuit board of the present disclosure includes the embedded capacitor and the substrate formed by using the perforating process and the mask etching process. The substrate is physically connected to the dielectric layer of the embedded capacitor, thereby improving the position accuracy of the embedded capacitor and the reliability of the circuit board. Forming the dielectric layer of the embedded capacitor through the perforating process can reduce a size of the embedded capacitor, thereby improving the degree of integration of the components of the circuit board, and embedded capacitors with various sizes and arrangements may be manufactured simultaneously. The mask etching process is used to form the electrodes of the embedded capacitor, so the electrode pads may be manufactured independently to reduce offset between the electrode pads and other components.

BRIEF DESCRIPTION OF THE DRAWINGS

Aspects of the present disclosure are best understood from the following detailed description when read in conjunction with the accompanying drawings. It should be noted that, in accordance with standard methods in the industry, various features are not drawn to scale. In fact, the dimensions of the various features may be arbitrarily increased or reduced for clarity of discussion.

FIGS. 3A-3T show various views of a circuit board at various intermediate stages of a manufacturing process according to some embodiments of the present disclosure.

DETAILED DESCRIPTION

Figure 1:
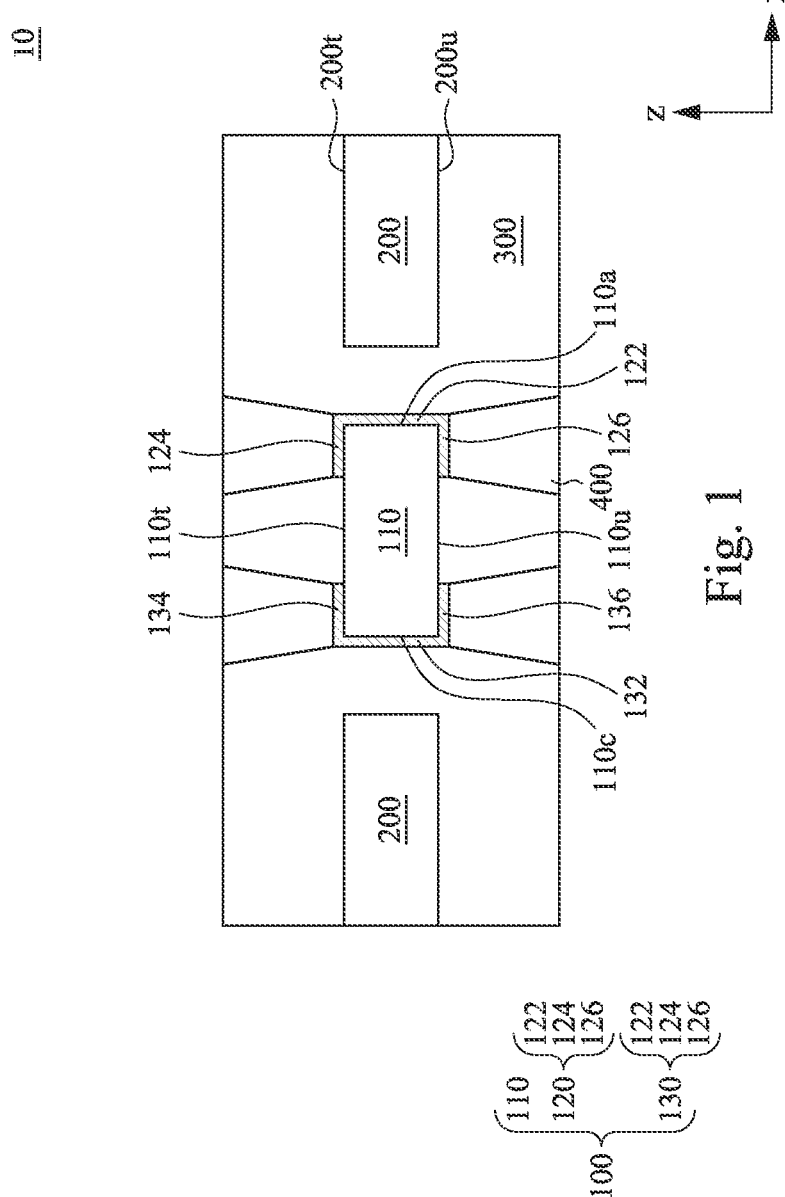
FIG. 1 shows a cross-sectional view of a circuit board according to an embodiment of the present disclosure.

The following disclosure provides many different embodiments or examples for implementing different features of the provided subject matter. Specific examples of components and arrangements are described below to simplify the present disclosure. These are, of course, merely examples and are not intended to be limiting. For example, in the following description, forming a first feature on or over a second feature may include embodiments in which the first and second features are formed in direct contact, and may also include embodiments in which an additional feature is formed between the first and second features, such that the first and second features may not be in direct contact. In addition, the present disclosure may repeat reference numerals and/or letters in the various examples. This repetition is for purposes of simplicity and clarity and does not inherently dictate a relationship between the various embodiments and/or configurations discussed.

Further, spatially relative terms, such as "beneath," "below," "lower," "above," "upper" and the like, may be used herein to describe the relationship of one element or feature to another element or feature as illustrated in the figures. The spatially relative terms are intended to encompass different orientations of the device in use or operation in addition to the orientation depicted in the figures. The device may be otherwise oriented (rotated 90 degrees or at other orientations), and the spatially relative descriptions used herein may likewise be interpreted accordingly.

It should be understood that although the terms "first", "second", "third" and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

The present disclosure provides a circuit board including an embedded capacitor and a method of manufacturing the same, in which a dielectric layer of the embedded capacitor is physically connected to a substrate, thereby improving positional accuracy of the embedded capacitor and reliability of the circuit board. The dielectric layer of the embedded capacitor is formed by a perforating process, and electrodes of the embedded capacitor is formed by a mask etching process, so a size (e.g., a volume) of the embedded capacitor may be reduced to improve degree of integration of components of the circuit board, and electrode pads may also be manufactured independently according to design requirements to reduce offset between the components.

According to an embodiment of the present disclosure, FIG. 1 shows a cross-sectional view of a circuit board 10. In order to clearly describe the components included in the circuit board 10, only some components of the circuit board 10 are shown in FIG. 1, but the circuit boards including additional components (e.g., a seed layer beneath the conductive layer, a system board electrically connected to the circuit board, etc.) are also within the scope of the present disclosure.

Referring to FIG. 1, the circuit board 10 includes an embedded capacitor 100, a substrate 200, an insulating layer 300 and a contact 400. The embedded capacitor 100 and the substrate 200 are located together in the insulating layer 300, so the embedded capacitor 100 and the substrate 200 may be regarded as components at the same level. For example, the embedded capacitor 100 and the substrate 200 may be located on the same plane. Furthermore, the substrate 200 is physically connected to the embedded capacitor 100, so that the embedded capacitor 100 may be accurately fixed at a designated position in the insulating layer 300. Therefore, when the contact 400 extends into the insulating layer 300 and is electrically connected to the embedded capacitor 100, risk of forming an offset conductive path by the contact 400 and the embedded capacitor 100 may be reduced, thereby improving the reliability of the circuit board 10.

Figure 2A:
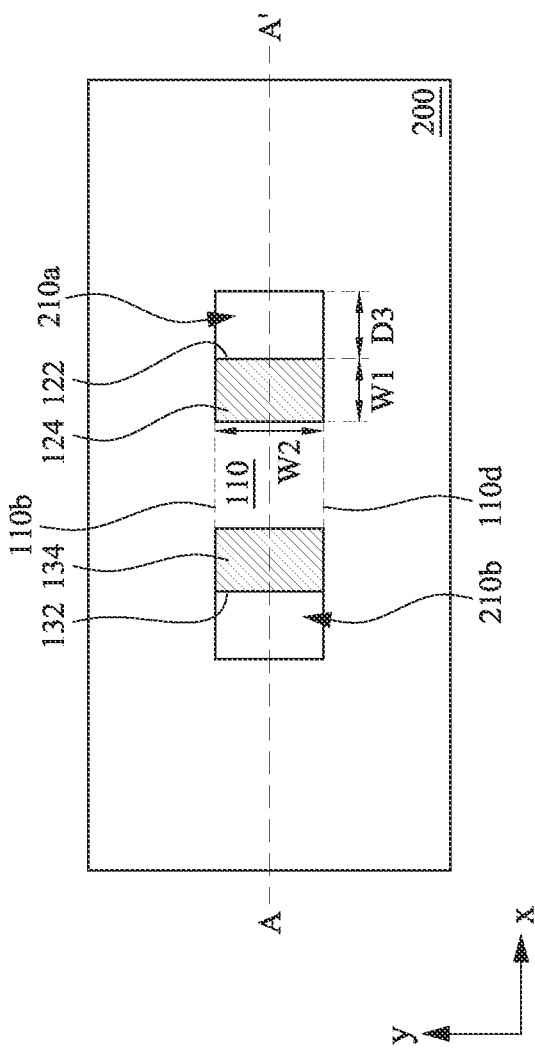
FIG. 2A and FIG. 2B show a top view and a cross-sectional view of an embedded capacitor and a substrate in FIG. 1.
Figure 2B:
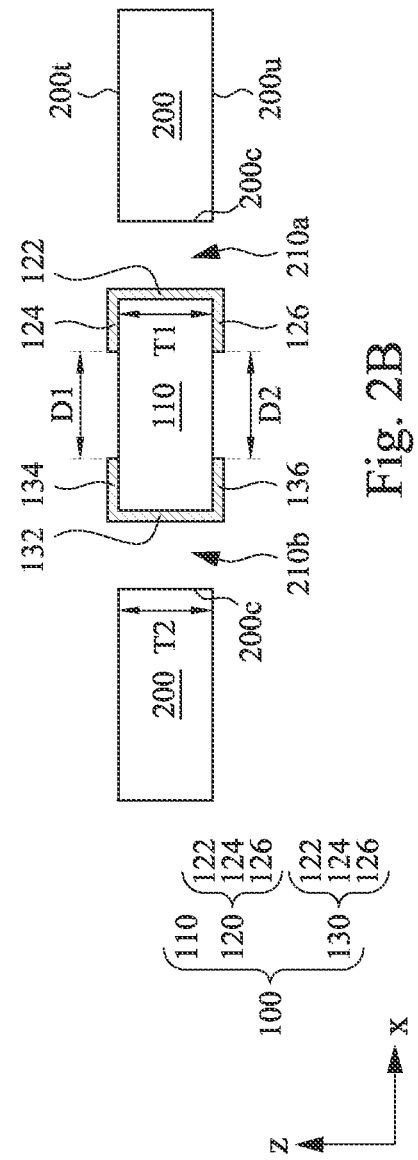

In order to more clearly describe a relationship between the embedded capacitor 100 and the substrate 200, FIG. 2A shows a top view of the embedded capacitor 100 and the substrate 200 in FIG. 1, and FIG. 2B shows a cross-sectional view along line A-A' of FIG. 2A. Referring to FIGS. 1 to 2B, the embedded capacitor 100 includes a dielectric layer 110 and a pair of a first electrode 120 and a second electrode 130. The dielectric layer 110 has a first side surface 110a, a second side surface 110b adjacent to the first side surface 110a, a third side surface 110c opposite to the first side surface 110a, a fourth side surface 110d opposite to the second side surface 110b, an upper surface 110t connecting the side surfaces 110a-110d, and a lower surface 110u connecting the side surfaces 110a-110d.

Although the dielectric layer 110 in FIGS. 1 to 2B is shown as a cuboid shape with straight sides, in other embodiments, the dielectric layer 110 may have arc-shaped sides, a cube shape, a trapezoidal shape or another shape. When the dielectric layer 110 has the trapezoidal shape, both the first side surface 110a and the third side surface 110c are inclined surfaces.

The first electrode 120 covers the first side surface 110a, and the second electrode 130 covers the third side surface 110c, so after a voltage is applied to the first electrode 120 and the second electrode 130, the dielectric layer 110 in between the first electrode 120 and the second electrode 130 may store electrical energy. More specifically, the first electrode 120 includes an electrode plate 122 on the first side surface 110a, a first pad 124 on the upper surface 110t, and a second pad 126 on the lower surface 110u. The electrode plate 122 physically connects the first pad 124 located on the dielectric layer 110 and the second pad 126 located beneath the dielectric layer 110 together, so that the first electrode 120 extends continuously from the upper surface 110t to the lower surface 110u along the first side surface 110a.

Similarly, the second electrode 130 includes an electrode plate 132 on the third side surface 110c, a first pad 134 on the upper surface 110t, and a second pad 136 on the lower surface 110u. The first pad 124 and the first pad 134 are separated from each other, and the second pad 126 and the second pad 136 are separated from each other. In some embodiments, a separation distance D1 between the first pad 124 and the first pad 134 in the x direction may be the same as a separation distance D2 between the second pad 126 and the second pad 136 in the x direction.

The first pad 124 of the first electrode 120 on the upper surface 110t may extend toward the second electrode 130 along the x direction, so the first pad 124 has a length W1 in the x direction shown in FIG. 2A. Similarly, the first pad 134 of the second electrode 130 may extend toward the first electrode 120 to have a length W1 in the x direction. In some embodiments, the embedded capacitor 100 may be composed of the dielectric layer 110, the first electrode 120 and the second electrode 130, so that a total length of the embedded capacitor 100 in the x direction is sum of twice the length W1 and the distance D1.

The first electrode 120 may completely cover the first side surface 110a, so that a width of the first electrode 120 is close to a width of the dielectric layer 110. As shown in FIG. 2A, opposite edges of the first electrode 120 may be respectively aligned with the second side surface 110b and the fourth side surface 110d of the dielectric layer 110, so that the first electrode 120 and the dielectric layer 110 both have a width W2 in the y direction. In some embodiments, the electrode plate 122, the first pad 124 and the second pad 126 may have the same width W2, so that the first electrode 120 has a uniform width as a whole. In such embodiments, as shown in FIG. 2A, an area of the first pad 124 on the upper surface 110t may be length W1×width W2, but the disclosure is not limited thereto.

The substrate 200 surrounds the embedded capacitor 100 and is physically connected to the embedded capacitor 100, so that the embedded capacitor 100 may be fixed at the same level as the substrate 200. Specifically, the substrate 200 is physically connected to the second side surface 110b and the fourth side surface 110d of the dielectric layer 110, so the dielectric layer 110 is fixed by the substrate 200 in the y direction. Since the substrate 200 is directly connected to the opposite side surfaces of the dielectric layer 110, the dielectric layer 110 may form a stable structure with the substrate 200, that is, the dielectric layer 110 may be firmly fixed in the substrate 200, thereby reducing or inhibiting relative movement between the dielectric layer 110 and the substrate 200 to avoid positional offset of the embedded capacitor 100.

It is worth noting that the dielectric layer 110 is connected to the substrate 200 through the second side surface 110b and the fourth side surface 110d, but in fact there is no interface or seam between the dielectric layer 110 and the substrate 200. Specifically, the dielectric layer 110 and the substrate 200 are a continuous dielectric material layer, in which the dielectric material layer between the first electrode 120 and the second electrode 130 serves as the dielectric layer 110 of the embedded capacitor 100, and the dielectric material layer surrounding the embedded capacitor 100 serves as the substrate 200. In other words, the substrate 200 and the dielectric layer 110 may be integrally formed into one piece, so that the directly connected substrate 200 and the dielectric layer 110 have the same material composition.

In some embodiments, an upper surface 200t and an lower surface 200u of the substrate 200 may be coplanar with the upper surface 110t and the lower surface 110u of the dielectric layer 110, respectively, so that the substrate 200 is physically connected to the entire second side surface 110b and the fourth side surface 110d, thereby providing stable connection between the substrate 200 and the dielectric layer 110. As shown in FIG. 2B, the dielectric layer 110 and the substrate 200 may be the continuous and uniformly thick dielectric material layer, in which a thickness T1 of the dielectric layer 110 in the z direction is the same as a thickness T2 of the substrate 200 in the z direction. For example, the thickness T1 of the dielectric layer 110 and the thickness T2 of the substrate 200 may be as small as 40 microns while still having stable connection.

The substrate 200 may be separated from the first side surface 110a and the third side surface 110c of the dielectric layer 110, so that at least two accommodation spaces may be formed between the substrate 200 and the dielectric layer 110. For example, as shown in FIGS. 2A and 2B, there may be a pair of an opening 210a and an opening 210b between the substrate 200 and the dielectric layer 110, and the first electrode 120 and the second electrode 130 may be respectively located in the opening 210a and the opening 210b, so that the first electrode 120 and the second electrode 130 may be located between the substrate 200 and the dielectric layer 110.

The opening 210a extends from the upper surface 200t of the substrate 200 to the lower surface 200u of the substrate 200, such that the first side surface 110a of the dielectric layer 110 and a sidewall 200a of the substrate 200 are located on opposite sides of the opening 210a. Similarly, the opening 210b extends through the substrate 200 to separate the third side surface 110c of the dielectric layer 110 from a sidewall 200c of the substrate 200 on opposite sides of the opening 210b.

The first electrode 120 extends along the opening 210a to cover the first side surface 110a of the dielectric layer 110, so the electrode plate 122 is located between the first side surface 110a and the sidewall 200a, and the electrode plate 122 and the sidewall 200a are separated from each other in the x direction. Similarly, the electrode plate 132 of the second electrode 130 is located between the third side surface 110c and the sidewall 200c, and the electrode plate 132 and the sidewall 200c are separated from each other. In some embodiments, a separation distance between the electrode plate 132 and the sidewall 200c in the x direction may be the same as a separation distance D3 between the electrode plate 122 and the sidewall 200a. Although the opening 210a and the opening 210b in FIGS. 2A to 2B are shown as rectangular shapes with straight sidewalls, in other embodiments, the opening 210a and the opening 210b may have a curved sidewall, a tapered sidewall, a cubic shape, a cylindrical shape or another shape.

Referring back to FIG. 1, the insulating layer 300 covers the embedded capacitor 100 and the substrate 200, so that the embedded capacitor 100 and the substrate 200 are located together in the insulating layer 300. Specifically, the insulating layer 300 covers the upper surface 110t and the lower surface 110u of the dielectric layer 110, the first electrode 120, the second electrode 130, and the upper surface 200t and the lower surface 200u of the substrate 200. Furthermore, the insulating layer 300 extends from the upper surface 200t of the substrate 200 to the lower surface 200u of the substrate 200 along the electrode plate 122 of the first electrode 120 and the sidewall 200a of the substrate 200, and the insulating layer 300 extends from the upper surface 200t of the substrate 200 to the lower surface 200u of the substrate 200 along the electrode plate 132 of the second electrode 130 and the sidewall 200c of the substrate 200. In other words, the insulating layer 300 fills the opening 210a between the first electrode 120 and the sidewall 200a and the opening 210b between the second electrode 130 and the sidewall 200c shown in FIG. 2B.

The contact 400 is located in the insulating layer 300, in which the contact 400 extends toward the embedded capacitor 100 and is electrically connected to the first electrode 120 and the second electrode 130. For example, a plurality of contacts 400 may extend from an outer surface of the insulating layer 300 to contact the first pad 124, the second pad 126, the first pad 134 and the second pad 136. In some embodiments, the contacts 400 may be in direct contact with the first pad 124, the second pad 126, the first pad 134 and the second pad 136, in which the contacts 400 are aligned with the respective pads, thereby forming a conductive path that the contacts 400 are aligned with the first electrode 120 or the second electrode 130.

Figure 3T:
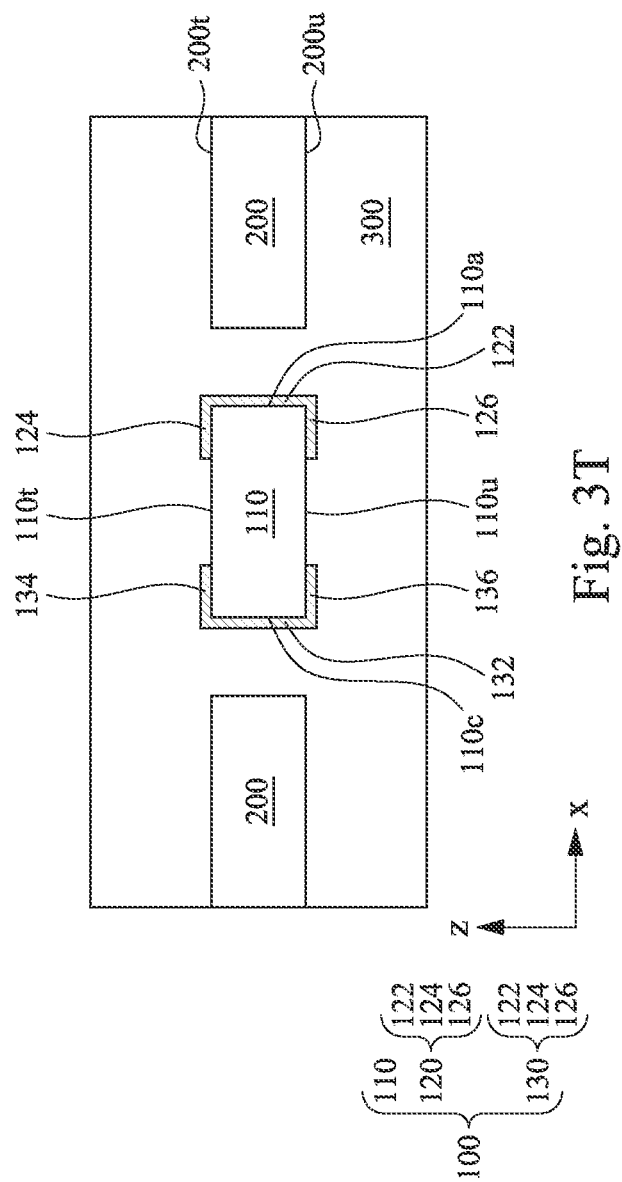

According to some embodiments of the present disclosure, FIGS. 3A-3T show various views of a circuit board at various intermediate stages of a manufacturing process. Specifically, FIGS. 3A, 3C, 3E, 3H, 3K, 3N and 3Q show top views of the circuit board at the various intermediate stages of the manufacturing process, and FIGS. 3B, 3D, 3F, 3I, 3L, 3O, 3R and 3T show cross-sectional views of the circuit board along line A-A' of the top views of the manufacturing process, and FIGS. 3G, 3J, 3M, 3P, and 3S show cross-sectional views of the circuit board along line B-B' of the top views of the manufacturing process. The manufacturing method shown in FIGS. 3A to 3T may be used to form the circuit board 10 described in FIGS. 1 to 2B, for example.

However, those skilled in the art will understand that the method of manufacturing the circuit board of the present disclosure may also be used to form another circuit board including an embedded capacitor within the scope of the present disclosure.

It is worth noting that, unless otherwise stated, when FIGS. 3A to 3T are shown or described as a series of steps of an embodiment, a description order of these steps should not be limited. For example, some steps may be taken in a different order than the described embodiment, some steps may occur simultaneously, some steps may not be used, and/or some steps may be repeated. Additionally, additional steps may be performed before, during, or after each of the steps depicted to fully form the circuit board.

Referring to FIGS. 3A to 3B, an initial substrate 20 is provided. Specifically, the initial substrate 20 includes at least one dielectric material layer, in which the dielectric material layer is used to form a dielectric layer of an embedded capacitor and a substrate connected to the embedded capacitor in subsequent steps. For example, the dielectric material layer may include silicon, ceramics, glass, epoxy glass, graphene oxide, other dielectric materials suitable for use as capacitors, or a combination thereof, in which the ceramics may include $BaTiO_3$, $CaTiO_3$, $SrTiO_3$ or $CaZrO_3$.

In some embodiments, the initial substrate 20 may further include a conductive film (not specifically shown) on the dielectric material layer. When a conductive layer (e.g., a conductive layer 500 shown in FIGS. 3E to 3G) is subsequently formed on the conductive film, the conductive film may enhance integrity and stability of the conductive layer. The conductive film may be a metal thin film, and a type of metal contained in the conductive film may be the same or similar to that contained in the subsequent conductive layer. For example, when the subsequent conductive layer includes copper metal, titanium/copper may be used as the material of the conductive film. In some examples, the conductive film may also be used as a seed layer for electroplating.

Referring to FIGS. 3C to 3D, a first perforating process is performed on the initial substrate 20 to form a pair of an opening 210a and an opening 210b, a dielectric layer 110 located between the opening 210a and the opening 210b, and a substrate 200 physically connected to the dielectric layer 110. Specifically, the first perforating process forms the opening 210a and the opening 210b extending from an upper surface of the initial substrate 20 to a lower surface of the initial substrate 20, in which the opening 210a and the opening 210b are aligned with each other in the x-direction, so the initial substrate 20 may be divided into the dielectric layer 110 between the opening 210a and the opening 210b and the substrate 200 surrounding the dielectric layer 110 along edges of the opening 210a and the opening 210b.

After the opening 210a and the opening 210b are formed, the dielectric layer 110 has a first side surface 110a and a third side surface 110c opposite to each other, in which the first side surface 110a faces the opening 210a and the sidewall 200a of the substrate 200, and the third side surface 110c faces the opening 210b and the sidewall 200c of the substrate 200. The dielectric layer 110 also has a second side surface 110b and a fourth side surface 110d opposite to each other, in which the second side surface 110b and the fourth side surface 110d are physically connected to the substrate 200. Since the dielectric layer 110 and the substrate 200 are two components divided by the opening 210a and the opening 210b, connection between the dielectric layer 110 and the substrate 200 has substantially no interface or seam.

The opening 210a and the opening 210b divide an area between the two openings into the dielectric layer 110 of the embedded capacitor. A distance between the opening 210a and the opening 210b in the x-direction may define a length of the dielectric layer 110 in the x-direction, and a distance between the opening 210a and the opening 210b in the y-direction may define a width of the dielectric layer 110 in the y direction. In other words, the opening 210a and the opening 210b may define a size (e.g. a volume) of the dielectric layer 110 of the embedded capacitor. Therefore, if a high-precision perforating process is used to form the opening 210a and the opening 210b with small sizes (e.g., the width in the x-direction or in the y-direction), the dielectric layer 110 and the subsequently formed embedded capacitor may have correspondingly small volumes. For example, the first perforating process may be laser drilling, routing, punching or other suitable perforating processes.

Referring to FIGS. 3E to 3G, a conductive layer 500 is formed on the substrate 200, on the dielectric layer 110, in the opening 210a and in the opening 210b. Specifically, the conductive layer 500 is formed on the structure shown in FIGS. 3C to 3D to cover the upper surface 200t of the substrate 200, the lower surface 200u of the substrate 200, the upper surface 110t of the dielectric layer 110, and the lower surface 110u of the dielectric layer 110. The conductive layer 500 is also formed in the opening 210a and the opening 210b to cover exposed surfaces in the openings, such as the sidewall 200a, the sidewall 200b and the sidewall 200d of the substrate 200 located in the opening 210a and the first side surface 110a of the dielectric layer 110 located in the opening 210a. Similarly, the conductive layer 500 also covers exposed surfaces in the opening 210b including the sidewall 200c and the third side surface 110c.

In some embodiments, formation of the conductive layer 500 may be conformal, so that a horizontal portion of the conductive layer 500 (e.g., the conductive layer 500 on the upper surface 110t) and a vertical portion (e.g., the conductive layer 500 on the first side surface 110a) have similar thicknesses. For example, the conductive layer 500 may be formed by evaporation, sputtering, electroplating, electroless plating or other suitable deposition techniques to form a conductive material including copper metal. In some examples, a plating through hole (PTH) technique of a process of manufacturing a circuit board may be adopted to form the conductive layer 500 in the opening 210a and the opening 210b.

In some embodiments, the conductive layer 500 is formed after the opening 210a and the opening 210b, and the conductive layer 500 does not fill the opening 210a and the opening 210b, thereby remaining voids in the opening 210a and the opening 210b, respectively. For example, as shown in FIG. 3F, a thickness of the conductive layer 500 may be smaller than a width of the opening 210a and that of the opening 210b in the x direction, so that a remained opening 210a separates the conductive layer 500 covering the first side surface 110a from the conductive layer 500 covering the sidewall 200a.

Referring to FIGS. 3H to 3J, a mask 600 is formed on the conductive layer 500 to shield the conductive layer 500 in the opening 210a and the opening 210b. Specifically, the mask 600 is formed on the conductive layer 500 on the upper surface 110t and the conductive layer 500 on the upper surface 200t, and the mask 600 is formed on the conductive layer 500 on the lower surface 110u and the conductive layer 500 on the lower surface 200u, so that both ends of the opening 210a and the opening 210b are shielded by the mask 600. For example, forming the mask 600 may include forming a photoresist material (e.g., a dry film) on the conductive layer 500, and patterning the photoresist material through steps such as exposure and development, so as to form the mask 600 completely shielding the opening 210a and the opening 210b.

Since the mask 600 shields the opening 210a and the opening 210b, in the subsequent etching process, portions of the conductive layer 500 located in the opening 210a and the opening 210b may be remained as unetched. In the embodiment where the conductive layer 500 does not fill the opening 210a and the opening 210b, a surface of the mask 600 in contact with the conductive layer 500 may be parallel to the upper surface 110t of the dielectric layer 110, so that the mask 600 does not fill the opening 210a and the opening 210b to remain the voids in the opening 210a and the opening 210b.

In addition to shielding the opening 210a and the opening 210b, the mask 600 may also shield portions of the conductive layer 500 located on the upper surface 110t and the lower surface 110u of the dielectric layer 110. In the subsequent processes, the shielded portions of the conductive layer 500 on the dielectric layer 110 will form electrode portions of the embedded capacitor, and relevant details will be described in detail below. In addition, the mask 600 may also shield portions of the conductive layer 500 located on the upper surface 200t and the lower surface 200u of the substrate 200. In some embodiments, the shielded portions of the conductive layer 500 on the substrate 200 will be subsequently removed, as shown in FIGS. 3Q to 3S. However, in some other embodiments, the shielded portions of the conductive layer 500 on the substrate 200 may be used as electrode portions of other embedded capacitors.

Referring to FIGS. 3K to 3M, an etching process is performed on the conductive layer 500 by using the mask 600 to remove portions of the conductive layer 500, which exposes the dielectric layer 110 and the substrate 200. Specifically, the etching process such as wet etching may be performed on the conductive layer 500, and the etching process is stopped on surfaces of the dielectric layer 110 and the substrate 200 to remain the parts of the conductive layer 500 shielded by the mask 600. In some other embodiments, the etching process may be an etching process that is selective to the metal material, and thus the conductive layer 500 that is not shielded by the mask 600 may be etched.

Since the mask 600 shields the opening 210a and the opening 210b, the portions of the conductive layer 500 located in the opening 210a and the opening 210b may be remained after the etching process. In an embodiment where the mask 600 shields the conductive layer 500 on the dielectric layer 110, the portions of the conductive layer 500 on the dielectric layer 110 are also remained after the etching process. As shown in FIG. 3L, the conductive layer 500 remained in the opening 210a and located on the first side surface 110a will serve as an electrode plate 122 of a first electrode 120, the conductive layer 500 remaining on the upper surface 110t will serve as a first pad 124 of the first electrode 120, and the conductive layer 500 remained on the lower surface 110u will serve as a second pad 126 of the first electrode 120. Similarly, the conductive layer 500 remained in the opening 210b, on the upper surface 110t and on the lower surface 110u will serve as an electrode plate 132, a first pad 134 and a second pad 136 of a second electrode 130. In other words, etching the conductive layer 500 by using the mask 600 may define patterns and sizes (e.g., the length and the width) of the first electrode 120 and the second electrode 130 of the embedded capacitor.

In an embodiment where the mask 600 shields the conductive layer 500 located on the substrate 200, the portions of the conductive layer 500 on the substrate 200 may be remained after the etching process. For example, as shown in FIG. 3L, the conductive layer 500 on the sidewall 200a of the substrate 200 in the opening 210a may be remained as a conductive portion 510, the conductive layer 500 on the upper surface 200t may be remained as a conductive portion 512, and the conductive layer 500 on the lower surface 200u may be remained as a conductive portion 514. In a subsequent embodiment shown in FIGS. 3Q to 3S, the conductive portions 510, 512 and 514 will be removed, but in some other embodiments, the conductive portions may be used as electrode portions of embedded capacitors. The conductive layer 500 in the opening 210a and located on the sidewalls 200b and 200d of the substrate 200 may also be remained as a conductive portion 516 and a conductive portion 518, and these conductive portions will be removed in subsequent processes.

Referring to FIGS. 3N to 3P, after the mask 600 is used to etch the conductive layer 500, the mask 600 is removed. After the mask 600 is removed, the opening 210a and the opening 210b are re-exposed, and the dielectric layer 110, the substrate 200, and conductive patterns on both are remained. In embodiments where the mask 600 includes a photoresist material, the photoresist may be stripped by using, for example, a photoresist stripper.

Referring to FIGS. 3Q to 3S, a part of the conductive pattern located on the first side surface 110a and the third side surface 110c of the dielectric layer 110 is remained, and other part of the conductive pattern outside the first side surface 110a and the third side surface 110c in the opening 210a and the opening 210b located is removed. Specifically, a second perforating process may be performed along the opening 210a and the opening 210b, in which opening positions avoid the conductive pattern on the first side surface 110a, thereby remaining the electrode plate 122 of the first electrode 120. In an embodiment where the first pad 124 and the second pad 126 are included on the dielectric layer 110, the second perforating process further remains the first pad 124 and the second pad 126 to form the first electrode 120 including the electrode plate 122, the first pad 124 and the second pad 126. Similarly, the second perforating process also remains the electrode plate 132, the first pad 134 and the second pad 136 of the second electrode 130. Therefore, the embedded capacitor 100 including the dielectric layer 110, the first electrode 120 and the second electrode 130 is formed after the second perforating process.

The second perforating process removes portions of the conductive patterns in the opening 210a and the opening 210b, so that the first electrode 120 and the second electrode 130 are independent from other conductive patterns, and therefore may be used as paired electrodes of the embedded capacitor 100. For example, as shown in FIG. 3S, the second perforating process may remove the conductive patterns located on the sidewall 200b and the sidewall 200d in the opening 210a (i.e., the conductive portion 516 and the conductive portion 518 shown in FIG. 3P), so that the first electrode 120 and the second electrode 130 become independent conductive patterns. In such an example, the same process step (e.g., drilling or profile cutting) may be used in the second perforating process and the first perforating process, but sizes and locations of the openings of the second perforating process is different from those of the first perforating process.

In some embodiments where the conductive patterns are remained on the substrate 200, the second perforating process may also expand the opening 210a in a direction away from the first side surface 110a and expand the opening 210b in a direction away from the third side surface 110c, thereby removing the conductive patterns on the substrate 200. For example, the second perforating process may remove the conductive portion 510, the conductive portion 512, the conductive portion 514 and a portion of the substrate 200 between the conductive portion 512 and the conductive portion 514 shown in FIG. 3O, so that the opening 210a expands toward the substrate 200 along the x direction. In such an example, the sidewall 200a will shrink toward the substrate 200, so that a width of the opening 210a shown in FIG. 3R is greater than a width of the opening 210a shown in FIG. 3O.

It should be noted that, in the embodiments shown in FIGS. 3Q to 3S, a single embedded capacitor 100 surrounded by the substrate 200 is formed, so only the electrode plate 122 in the opening 210a and electrode plate 132 in the opening 210b are remained. However, in other embodiments where the substrate 200 surrounds the embedded capacitor 100 and additional embedded capacitor adjacent to embedded capacitor 100, the conductive portion 510, the conductive portion 512, and the conductive portion 514 shown in FIG. 3O may be remained as electrodes of the additional embedded capacitor, so the present disclosure is not limited thereto.

Referring to FIG. 3T, an insulating layer 300 is formed on the dielectric layer 110 and the substrate 200, so that the insulating layer 300 covers the embedded capacitor 100 and the substrate 200. Specifically, the insulating layer 300 may be directly formed on the structure shown in FIGS. 3Q to 3S, so that the insulating layer 300 is in physical contact with the upper surface 110t and the lower surface 110u of the dielectric layer 110, the upper surface 200t and the lower surface 200u of the substrate 200, the first electrode 120 and the second electrode 130. The insulating layer 300 further extends into the opening 210a and the opening 210b to be in physical contact with the electrode plate 122 on the first side surface 110a and the electrode plate 132 on the third side surface 110c. Since the insulating layer 300 extends from the upper surface 110t and the upper surface 200t to the lower surface 110u and the lower surface 200u along the opening 210a and the opening 210b, the embedded capacitor 100 and the substrate 200 may form stably connected components in the same level.

Manufacturing the circuit board including the embedded capacitor according to the method of the present disclosure can bring several advantages. The method of the present disclosure combines formation and etching of the conductive layer through the perforating process to manufacture the embedded capacitor connected to the substrate, so the manufacturing process may be simplified and the embedded lamination process may be omitted, thereby improving the position accuracy of the embedded capacitor and the reliability of the circuit board. Since the same material layer is used to form the substrate and the dielectric layer of the embedded capacitor, there is high-strength connection between the substrate and the embedded capacitor, so a thickness of the embedded capacitor may be reduced while maintaining the stability of the circuit board structure.

The method of the present disclosure defines the length and the width of the dielectric layer of the embedded capacitor by the perforating process, and the electrodes are directly formed on the dielectric layer by the mask etching process, so the method of the present disclosure can manufacture the small-sized and precisely positioned embedded capacitor to improve the degree of integration of the components of the circuit board. The mask etch process also helps to reduce a distance between paired pads of the embedded capacitor, thereby reducing the size of the embedded capacitor. For example, the distance between the paired pads (e.g., the distance D1 shown in FIG. 2B) may be as small as 20 microns while the embedded capacitor is still precisely formed at the designated location in the circuit board. In the above example, a volume of the embedded capacitor may be as small as 270 microns×120 microns×40 microns cubic microns.

Since the length and the width of the embedded capacitor mainly depend on the sizes and the distance of the paired openings formed by the perforating process, various sizes of embedded capacitors may be manufactured in the same substrate simultaneously or an embedded capacitor with a non-standard size may be manufactured according to requirement of a capacitance value, and various arrangements of embedded capacitors may also be provided according to design requirements. In addition, the position of the embedded capacitor also depends on the paired openings formed by the perforating process, which makes the positioning of the embedded capacitor highly precise and less likely to cause issues such as short circuits between different embedded capacitors. Therefore, the distance between the embedded capacitors can be shortened to improve the degree of integration of the components of the circuit board.

Figure 4:
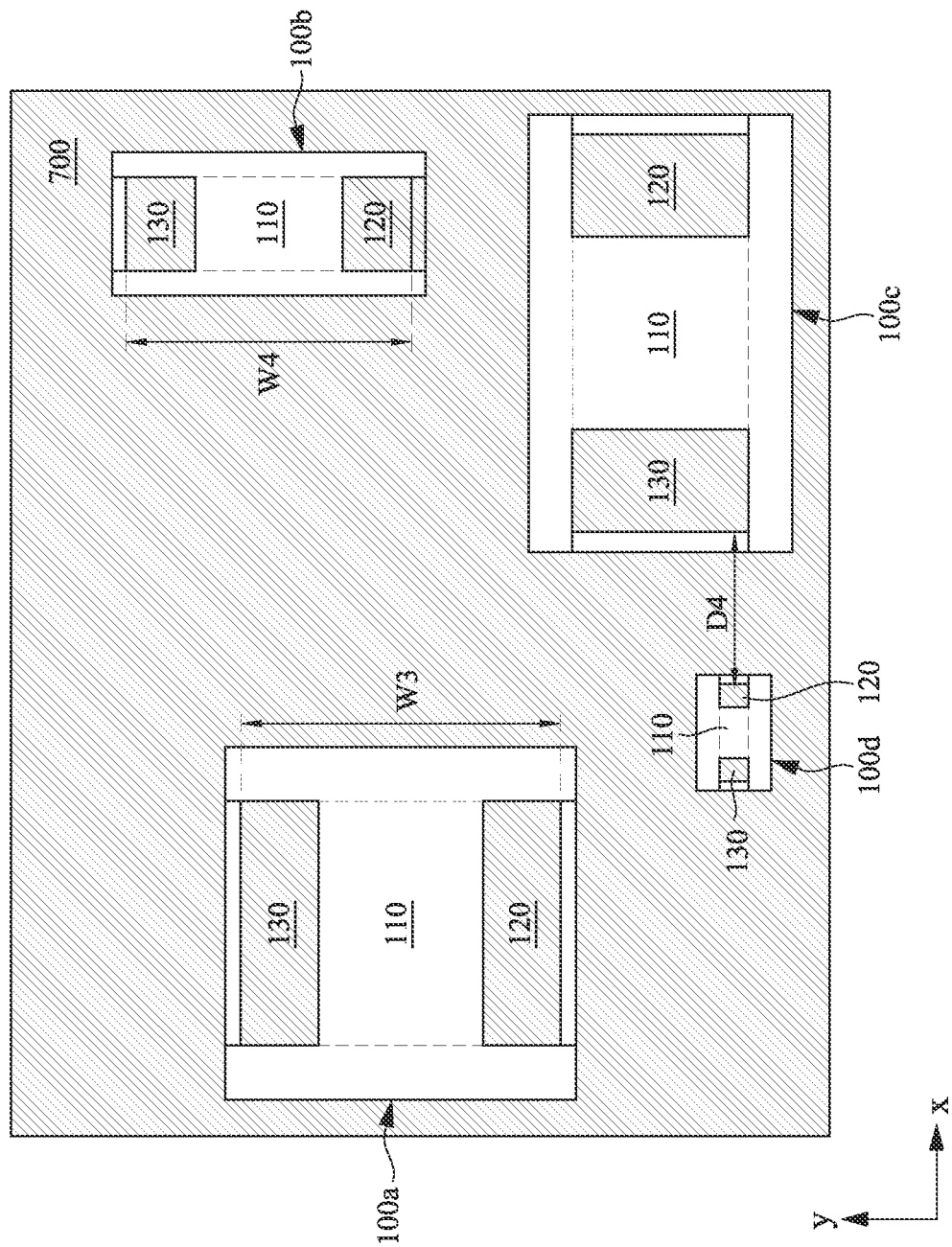
FIG. 4 shows a top view of a circuit board according to some embodiments of the present disclosure.

In order to illustrate the above advantages, FIG. 4 shows a top view of a circuit board 30 according to some embodiments of the present disclosure. The circuit board 30 includes embedded capacitors 100a to 100d, in which each of the embedded capacitors 100a to 100d has a structure similar to that of the embedded capacitor 100 shown in FIG. 3T. In other words, each of the embedded capacitors 100a to 100d includes a pair of a first electrode 120 and a second electrode 130 and a dielectric layer 110 between the first electrode 120 and the second electrode 130.

As shown in FIG. 4, since the perforating process can simultaneously form pairs of openings with different sizes and distances, a length W3 of the dielectric layer 110 of the embedded capacitor 100a in the y direction may be different from a length W4 of the dielectric layer 110 of the embedded capacitor 100b in the y direction. Furthermore, sizes of pads of the embedded capacitor 100a and the embedded capacitor 100b correspond to the openings, respectively, so an area of the pad of the first electrode 120 of the embedded capacitor 100a located on the dielectric layer 110 may be different from an area of the pad of the first electrode 120 of the embedded capacitor 100b located on the dielectric layer 110.

The embedded capacitor 100c and the embedded capacitor 100d shown in FIG. 4 are adjacent capacitors, in which there is a distance D4 between the embedded capacitor 100c and the embedded capacitor 100d. Since the perforating process can accurately form paired openings of the embedded capacitor 100c and the embedded capacitor 100d, it is not necessary to reserve a large distance D4, and short circuits between the embedded capacitor 100c and the embedded capacitor 100d can be avoided. For example, the distance D4 between the embedded capacitor 100c and the embedded capacitor 100d may be as small as 20 microns without causing failure of the embedded capacitor 100c and the embedded capacitor 100d. In some embodiments, the first electrode 120 of the embedded capacitor 100c and the second electrode 130 of the embedded capacitor 100d may share the same opening, that is, the distance D4 between the embedded capacitor 100c and the embedded capacitor 100d is a width of an opening.

In addition to defining the size of the embedded capacitor, the mask etching process used in the method of the present disclosure defines the sizes of the pads of the embedded capacitor, so that the electrode pads may be independently manufactured for corresponding contacts, reducing offset between the contact and the pad. For example, in an embodiment where a laser drilling process is used to form contact openings, an area of the electrode pad (e.g., length W1×width W2 shown in FIG. 2A) formed by the perforating processes and the mask etching process may be as small as 120×120 square microns while the electrode pad still aligns and matches the area of the subsequently formed contact.

In addition, the mask etching process may also form a trace in the same level as the electrode pads while forming the pads of the embedded capacitor. For example, as shown in FIG. 4, the circuit board 30 may include a trace 700 on the substrate, in which the trace 700 and the first electrode 120/second electrode 130 undergo the same conductive layer formation and etching steps, so the trace 700 and the first electrode 120/second electrode 130 are located in the same level. In an embodiment where the trace 700 and the first electrode 120/second electrode 130 are formed from a uniform conductive layer, the trace 700 and the pads of the first electrode 120/second electrode 130 may have the same thickness, but in other embodiments, the trace 700 may also be reprocessed to have a thickness different from that of the first electrode 120/second electrode 130.

According to the above-mentioned embodiments of the present disclosure, the present disclosure manufactures the circuit board including the embedded capacitor through the perforating processes and the mask etching process, so that the small-sized and accurately positioned embedded capacitor may be manufactured by using the simplified processes, thereby improve the reliability of the circuit board and the degree of integration of the components. The dielectric layer of the embedded capacitor is physically connected to the substrate of the same layer in the circuit board, and the design of the electrode pads of the embedded capacitor may be independent from the dielectric layer, thus reducing risk of occurring offset between the embedded capacitor and other components of the circuit board.

The foregoing outlines features of several embodiments, so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board, comprising:
   a first embedded capacitor, comprising a dielectric layer, a first electrode and a second electrode, wherein the dielectric layer has a first side surface, a second side surface adjacent to the first side surface, a third side surface opposite to the first side surface, and a fourth side surface opposite to the second side surface, wherein the first electrode and the second electrode cover the first side surface and the third side surface respectively, wherein the first electrode comprises a first pad on the dielectric layer, a second pad beneath the dielectric layer, and an electrode plate physically connecting the first pad and the second pad;

a substrate, surrounding the first embedded capacitor, wherein the substrate is physically connected to the second side surface and the fourth side surface of the dielectric layer, and the first electrode is located between the first side surface and a sidewall of the substrate; and an insulating layer, covering the first embedded capacitor and the substrate, wherein the insulating layer extends from an upper surface of the substrate to a lower surface of the substrate along the first electrode and the sidewall.

2. The circuit board of claim 1, wherein the substrate and the dielectric layer are integrally formed into one piece.

3. The circuit board of claim 1, wherein the dielectric layer has an upper surface connecting the first side surface and the second side surface, and the upper surface of the substrate and the upper surface of the dielectric layer are coplanar.

4. The circuit board of claim 1, further comprising a trace on the upper surface of the substrate, wherein the first pad and the trace have a same thickness.

5. The circuit board of claim 1, further comprising a contact located in the insulating layer and electrically connected to the first electrode, wherein an area of the first pad matches an area of the contact.

6. The circuit board of claim 1, wherein the first electrode comprises a first pad on the dielectric layer, the second electrode comprises a second pad on the dielectric layer, and the second pad and the first pad are separated from each other.

7. The circuit board of claim 6, wherein a total length of the first embedded capacitor is a sum of a length of the first pad, a length of the second pad and a distance between the first pad and the second pad.

8. The circuit board of claim 1, wherein opposite edges of the first electrode are respectively aligned with the second side surface and the fourth side surface of the dielectric layer.

9. The circuit board of claim 1, wherein the dielectric layer and the substrate are formed of a dielectric material comprising silicon, ceramics, glass, epoxy glass, graphene oxide, or a combination thereof.

10. The circuit board of claim 1, wherein the insulating layer fills between the first electrode and the sidewall of the substrate and fills between the second electrode and the substrate.

11. The circuit board of claim 1, further comprising a second embedded capacitor, wherein the second embedded capacitor comprises a dielectric layer, a third electrode and a fourth electrode, and a length of the dielectric layer of the second embedded capacitor between the third electrode and the fourth electrode is different from a length of the dielectric layer of the first embedded capacitor between the first electrode and the second electrode.

12. The circuit board of claim 1, further comprising a second embedded capacitor, wherein the second embedded capacitor comprises a dielectric layer and, a third electrode and a fourth electrode, and a pad area of the first electrode on the dielectric layer of the first embedded capacitor is different from a pad area of the third electrode on the dielectric layer of the second embedded capacitor.

13. A method of manufacturing a circuit board, comprising:

providing an initial substrate;

performing a first perforating process on the initial substrate to form a pair of openings, a dielectric layer between the pair of the openings, and a substrate physically connected to the dielectric layer, wherein the dielectric layer has a pair of side surfaces facing the pair of the openings and opposite to each other;

forming a conductive layer on the substrate, on the dielectric layer and in the pair of the openings;

forming a mask on the conductive layer, wherein the mask at least shields the pair of the openings;

etching the conductive layer by using the mask to expose the dielectric layer and the substrate and remaining the conductive layer in the pair of the openings;

after etching the conductive layer by using the mask, removing the mask; and after removing the mask, remaining a part of the conductive layer on the pair of the side surfaces of the dielectric layer and removing other part of the conductive layer outside the pair of the side surfaces in the pair of the openings.

14. The method of claim 13, wherein the step of forming the mask on the conductive layer comprises shielding a conductive portion of the conductive layer on the dielectric layer with the mask; and wherein the step of remaining the conductive layer after removing the mask further comprising remaining the conductive portion on the dielectric layer.

15. The method of claim 13, wherein the step of removing the other part of the conductive layer outside the pair of the side surfaces in the pair of the openings comprises performing a second perforating process along the pair of the openings to expand the pair of the openings in a direction away from the pair of the side surfaces.

16. The method of claim 15, wherein same process steps are used in the first perforating process and the second perforating process.

17. The method of claim 15, wherein the step of forming the mask on the conductive layer comprises shielding a conductive portion of the conductive layer with the mask, the conductive portion being on a substrate portion of the substrate; and wherein the step of performing the second perforating process comprises removing the conductive portion and the substrate portion.

18. The method of claim 13, wherein the step of forming the conductive layer in the pair of the openings comprises remaining a pair of voids in the pair of the openings; and wherein the step of forming the mask on the conductive layer comprises remaining the pair of the voids in the pair of the openings.

19. The method of claim 13, further comprising forming an insulating layer on the dielectric layer and on the substrate, wherein the insulating layer is in physical contact with the dielectric layer and the substrate, and wherein the insulating layer extends into the pair of the openings to be in physical contact with the conductive layer on the pair of the side surfaces.

* * * * *